(12) United States Patent
Hall et al.

(10) Patent No.: US 7,381,290 B2
(45) Date of Patent: Jun. 3, 2008

(54) MICROWAVE PLASMA GENERATOR

(75) Inventors: Stephen Ivor Hall, Oxford (GB); Robert Frew Gillespie, Abingdon (GB); James Timothy Shawcross, Charlbury (GB)

(73) Assignee: Qinetiq Limited (GB)

( * ) Notice: Subject to any disclaimer, the term of this patent is extended or adjusted under 35 U.S.C. 154(b) by 47 days.

(21) Appl. No.: 10/491,776

(22) PCT Filed: Oct. 25, 2002

(86) PCT No.: PCT/GB02/04865

§ 371 (c)(1),
(2), (4) Date: Apr. 6, 2004

(87) PCT Pub. No.: WO03/041111

PCT Pub. Date: May 15, 2003

(65) Prior Publication Data

US 2004/0256056 A1    Dec. 23, 2004

(30) Foreign Application Priority Data

Nov. 3, 2001   (GB) ................................. 0126419.1

(51) Int. Cl.
C23C 16/00 (2006.01)
C23F 1/00 (2006.01)
H01L 21/306 (2006.01)

(52) U.S. Cl. ........................ 156/345.41; 118/723 MW; 156/345.36

(58) Field of Classification Search ........... 156/345.36, 156/345.41; 118/723 MW
See application file for complete search history.

(56) References Cited

U.S. PATENT DOCUMENTS

| 4,393,333 | A | * | 7/1983 | Sakudo et al. | 315/111.81 |
| 5,418,430 | A | * | 5/1995 | Bayliss | 315/111.21 |
| 5,425,832 | A | * | 6/1995 | Kusano et al. | 156/272.6 |
| 5,436,036 | A | * | 7/1995 | Shiomi et al. | 427/575 |
| 5,503,807 | A | * | 4/1996 | Griffiths et al. | 422/186.04 |
| 6,126,779 | A | * | 10/2000 | Gillespie et al. | 156/348 |
| 6,204,606 | B1 | | 3/2001 | Spence | |
| 6,388,381 | B2 | * | 5/2002 | Anders | 315/111.21 |
| 2003/0175181 | A1 | * | 9/2003 | Hall et al. | 422/186 |

FOREIGN PATENT DOCUMENTS

| WO | 99/38007 | 7/1999 |
| WO | 00/14539 | 3/2000 |

* cited by examiner

Primary Examiner—Parviz Hassanzadeh
Assistant Examiner—Rakesh K Dhingra
(74) Attorney, Agent, or Firm—McDonnell Boehnen Hulbert & Berghoff LLP

(57) ABSTRACT

A microwave plasma generator including field-enhancing electrodes consisting of opposed laminae (108,109) with a gap (110) between them orthogonal to the direction of propagation through the plasma generator of microwave radiation. Gas inlet (106) and outlet (107) ports are arranged so that a gaseous medium to be excited into the plasma state passes through the gap (110).

14 Claims, 2 Drawing Sheets

MICROWAVE PLASMA GENERATOR

The present invention relates to the generation by microwave radiation of plasmas in gaseous media.

The use of plasmas for materials processing is of increasing importance. Examples are: the modification of the surface properties of materials, the sterilisation of medical items such as prostheses or surgical instruments, the plasma assisted catalysis of $NO_x$, the reduction or removal of polyfluorinated hydrocarbons, the plasma spraying or volatilisation of metals, as sources of plasma for use in spectroscopic or other diagnostic techniques or the vitrification of nuclear waste.

Many existing microwave plasma generators couple microwave radiation uniformly into a chamber through which a gaseous medium which is to be excited into a plasma state is passed. The energy density is therefore low unless high electrical power inputs are used, which results in low electrical efficiencies.

Our patent GB 2,273,027 discloses a microwave plasma generator in which a gaseous medium to be excited into a plasma state is passed into a chamber in which there is included a pair of electric field-enhancing electrodes situated perpendicular to the direction of propagation of microwave plasma through the chamber at least one of the electrodes having a passageway formed in it so that the excited gaseous material can be withdrawn from the region between the electrodes.

The arrangement has two principal advantages, firstly the field-enhancing electrodes increase the efficiency of the excitation of the gaseous medium, and secondly, as the only exit for the gaseous medium is via the region of maximum electric field, all the gaseous medium is subjected to the maximum electric field, again increasing the electrical efficiency of the excitation process.

However, the electrode arrangement disclosed in specification GB 2,273,027 has circular symmetry, with the extraction of the gaseous medium taking place axially through one of the field-enhancing electrodes, which although stabilising the plasma, limits the throughput of the gaseous medium, and hence the output of plasma excited species from the chamber.

It is an object of the present invention to provide an improved microwave plasma generator.

According to the present invention there is provided a microwave plasma generator comprising a chamber adapted to be coupled to a source of microwave radiation, inlet and outlet ports by means of which a gaseous medium to be energised into a plasma state can be caused to flow through the chamber and at least one pair of electric field-enhancing electrodes which define between them a gap which extends substantially linearly in a direction substantially orthogonal to the direction of propagation of microwave radiation through the chamber and arranged such that the gaseous medium flowing through the said chamber passes through the said gap.

By substantially orthogonal we mean that the linear extent of the gap is ideally exactly orthogonal to the direction of propagation of the microwaves but as a practical matter may deviate from the orthogonal by a few degrees with little effect, but, to avoid significant loss of field enhancing effectiveness, should not deviate from the orthogonal by more than a few degrees.

By "substantially linearly" we mean that the gap ideally is precisely linear in its extent but may have slight curvature or even gentle corrugation or other small departure from precise linearity, but, again to avoid significant loss of field enhancing effectiveness, should not deviate very much from linearity. Corrugation or any other departure from linearity may require changes in tuning and matching to ensure microwave energy is deposited in the region of the gap where the gas is to be treated by plasma.

The electrodes may be triangular in cross-section with the gap formed between opposed edges which are in a plane transverse to the direction of propagation of the microwaves in the chamber. However, the opposed edges of the electrodes can also be flat, in which case the cross-sectional shape of the electrodes is conveniently rectangular.

Conveniently the gap is of uniform width along its linear extent substantially orthogonal to the direction of propagation of the microwaves. However, a variation in width of the gap is possible, and may be beneficial, provided the variation is symmetrical about the centre of the gap and the gap is narrower at the edges than at its centre. Thus, for example the gap may have an elliptical shape.

The outlet port may comprise a linear array of holes, or a slot so that the energised gaseous medium emerges as a sheet of gas containing plasma excited species.

One or both of the electrodes may be doubled, that is to provide two electrode components with a space between them, and the said array of holes or slot may be situated between the two components of the doubled electrode, or between the two components of one of the doubled electrodes.

Alternatively, or additionally, the inlet port may comprise a linear array of holes or a slot positioned between the two components of a doubled electrode.

The electrodes or electrode components may comprise laminar elements.

The invention will now be described, by way of example, with reference to the accompanying drawings in which.

Figure 1:
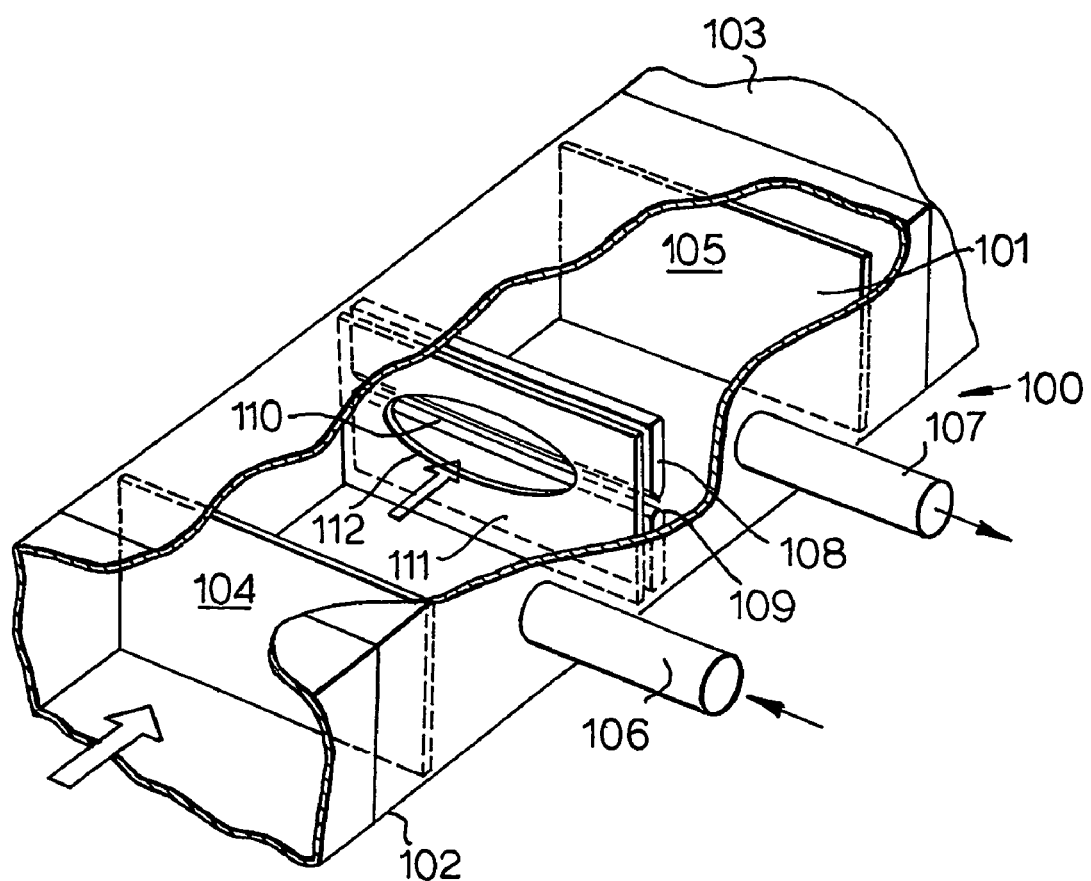
FIG. 1 is a schematic sectional view of a microwave plasma generator embodying the invention.

Referring to FIG. 1 of the drawings, a microwave plasma generator 100 consists of a chamber 101 of rectangular cross-section such as to transmit microwave radiation at a frequency in the region of 2.45 GHz which is coupled to a wave guide 102 and thence to a source of microwave power of a frequency in the region of 2.45 GHz (not shown in the drawing) and to a second wave guide section 103 which terminates in a short-circuiting stub (not shown in the drawing). The chamber 101 is physically separated from the wave guides 102, 103 by gas tight membranes 104, 105 which are made of a plastics material which is transparent to microwave radiation. Other materials that are transparent to microwave radiation such as quartz can be used as the gas-tight membranes. The chamber 101 is provided with gas inlet and plasma excited gas outlet ports 106, 107 respectively. Situated approximately symmetrically within the chamber 101 are electric-field enhancing electrodes consisting of two opposed metal laminae 108, 109 between which there is a parallel-sided gap 110 of a millimetre or so in width.

The upstream faces of the laminae 108, 109 are protected by a baffle 111 which has an elongated central orifice 112. In this example the opposed edges of the laminae 108, 109 are knife-edged so as further to enhance the electric field between them. A preferred material for the chamber 101 is stainless steel, which also can be used for the laminae 108, 109. However, to assist with their cooling, the laminae may be made of a material such as a copper or aluminium alloy with tips made of a refractory metal such as tungsten, or a ceramic material. Also, the laminae 108, 109 may be hollow in construction and provided with water-cooling facilities. Non-magnetic materials can be used for the electrodes and tips.

In use, all the gaseous medium to be excited into the plasma state has to pass through the region of enhanced electric field between the laminae 108, 109. Also the pressure drop experienced by the gaseous medium as it passes through the gap 110 between the edges of the laminae 108, 109 further increases the efficiency of the excitation process.

The gas outlet port 107 may take the form of a rectangular slot in one of the major walls of the chamber 101 whereby gas containing plasma excited species emerges in the form of a sheet instead of a jet, which may be more appropriate for purposes such as the treatment of extended surfaces.

Figure 2:
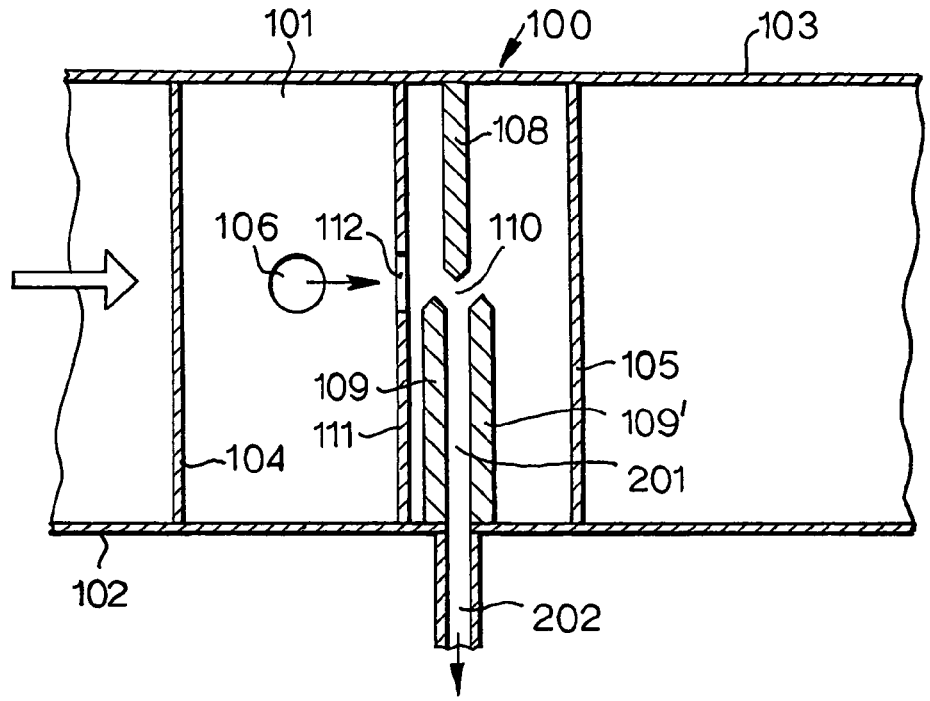
FIG. 2 is a schematic longitudinal section of a second embodiment of the invention.

FIG. 2 is a longitudinal section of a second embodiment of the invention in which components which have the same function as corresponding components in the first embodiment of the invention have the same reference numerals.

In this embodiment of the invention, the lamina 109 of the field-enhancing electrodes is accompanied by a second similar lamina 109' separated from it by a gap 201 which communicates with a gas exit slit 202. The lamina 108 of the field enhancing electrodes is positioned opposite the gap 201 between the laminae 109, 109' and the membrane 105 is positioned adjacent the lamina 109' of the field-enhancing electrode so as to reduce the dead-space downstream of the field-enhancing electrodes.

This form of microwave plasma generator produces an output of plasma excited gas in the form of a sheet, which is advantageous for some purposes such as the treatment of extended surfaces.

With this arrangement gas input to the chamber may be via both sides of the field enhancing electrodes, that is, for example, using the configuration of ports shown in FIG. 1, gas input via both ports 106 and 107. This further allows different gases to be introduced via the respective two ports. The gases may then react in the plasma formed between the field enhancing electrodes before exiting via gas exit slit 202.

Figure 3:
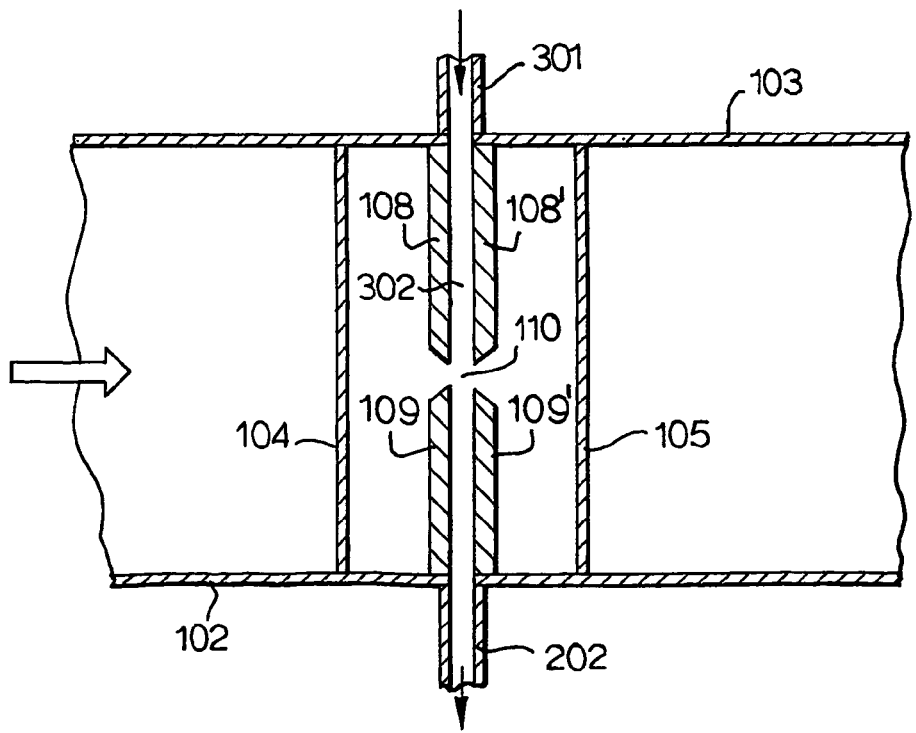
FIG. 3 is a schematic longitudinal section of a third embodiment of the invention.

FIG. 3 is a longitudinal section of a third embodiment of the invention in which the lamina 108 of the field-enhancing electrodes also is doubled and a gaseous medium to be energised is admitted into the chamber 101 via an inlet port 301 which communicates with the gap 302 between the laminae 108, 108'. This arrangement also provides that all the gaseous medium passes through the region of maximum electric field, so increasing the electrical efficiency of the plasma generator and also allowing the microwave entrance window membrane 104 to be brought close to the electric field-enhancing electrode as well as the microwave exit window membrane 105, so reducing the length of the plasma generator. In this embodiment the baffle 111 is redundant and is omitted.

In the second and third embodiments of the invention, the doubled laminae have a symmetrical knife-edge as the laminae 108, 109 of the first embodiment of the invention, as is shown in FIG. 2, or an asymmetrical form as shown in FIGS. 3.

The invention is not restricted to the details of the foregoing examples. For instance the opposed edges of the field enhancing electrodes need not necessarily have a knife or sharp edge form, but may be flat. Conveniently the thickness of the opposed edges of the electrodes is of the order of 1 mm to 2 mm but can be significantly more than this. Laminae providing the field enhancing electrodes can be of similar thickness, provided they are strong enough to resist buckling under the heat generated by the plasma. As indicated above, provision of coolant passages in the electrodes may be required, in which case a thicker structure will result.

The width of gap between the electrodes is chosen so as to provide sufficient field enhancement for the plasma to strike at the required gas pressure of operation. Thus for operation at or near atmospheric pressure a gap width of the order of 1 mm is required. For lower pressure operation a wider gap can be adopted.

With this in mind, a modification may provide for the gap between the electrodes to be adjustable so that the plasma generator can readily be adapted for optimum operation for a given gas composition and operating pressure.

Enhanced throughput of the gaseous medium allows the microwave plasma generator described herein suitable for the treatment of chemical warfare gases such as sarin, phosgene and other toxic components used in chemical weapons as well as the destruction of nerve agents and biological agents such as spores, for example anthrax spores, bacteria and viruses, naturally occurring or modified by genetic engineering techniques or combinations of chemical warfare gases and biological agents. The plasma generator may be incorporated into ventilation systems in buildings, fixed or portable, tents, bunkers above or below ground, ships, submarines, aircraft, vehicles. It may be part of a system for the detection and treatment of gases and agents. The system can include sensors for the detection of such gases and agents and these sensors can be based on microfabricated cantilevers for example as disclosed in WO99/38007 and WO 00/14539. The plasma generator can be run continuously or intermittently depending on the response of the sensor. Catalysts can be incorporated into the system downstream of the exhaust gases emitted from the plasma generator for the conversion of nitrogen oxides, produced in the plasma, to nitrogen. The plasma generator can also be used for the deactivation of prion proteins.

The invention claimed is:

1. A microwave plasma generator comprising a chamber for receiving microwave radiation, said chamber having inlet and outlet ports for carrying a flow of gaseous medium to be energized into a plasma state, and at least one pair of spaced-apart planar electric field-enhancing electrodes, said field enhancing electrodes extending in planes generally orthogonal to the direction of propagation of the microwave radiation through said chamber and having opposed edges defining between the edges an elongate gap extending substantially linearly in a direction substantially orthogonal to the direction of propagation of microwave radiation through said chamber; and said gap being oriented such that all the gaseous medium flowing through said chamber passes through said gap.

2. A microwave plasma generator according to claim 1, further characterised in that the outlet port is so shaped that the plasma excited gaseous medium emerges in the form of a sheet.

3. A microwave plasma generator according to claim 1, said electrodes having opposed edges defining said gap, and having tapering cross-sections.

4. A microwave plasma generator according to claim 3, further characterised in that said cross-sections of said opposed edges of said electrodes are asymmetric.

5. A microwave plasma generator according to claim 1, including a further electrode for providing two parallel adjacent similar electrode components.

6. A microwave plasma generator according to claim 5, wherein said two adjacent similar electrode components define a space that communicates with a an adjacent gas port.

7. A microwave plasma generator according to claim 6, wherein said adjacent gas port is of rectangular cross-section.

8. A microwave plasma generator according to claim 6, wherein said gas port of rectangular cross-section is the outlet port of said chamber for shaping said outflowing gaseous medium in the form of a sheet.

9. A microwave plasma generator according to claim 1, further characterised in that said electrodes are made of a metal of high thermal conductivity and are provided with an edge made of a refractory material.

10. A microwave plasma generator according to claim 1, wherein channels are provided for said electrodes for the flow of a coolant fluid.

11. A microwave plasma generator according to claim 1 wherein said electrodes are of laminar form.

12. A microwave plasma generator according to claim 1, wherein said gap between said electrodes is in the form of a slot.

13. A microwave plasma generator according to claim 1, wherein said gap is of uniform width along its length.

14. A microwave plasma generator according to claim 1, wherein the width of said gap is greater at the centre and diminishes symmetrically towards its ends.

\* \* \* \* \*